(12) United States Patent
Takahashi et al.

(10) Patent No.: US 9,699,927 B2
(45) Date of Patent: Jul. 4, 2017

(54) CABLE FIXING DEVICE

(71) Applicant: TEAC Corporation, Tokyo (JP)

(72) Inventors: Yasumasa Takahashi, Kanagawa (JP); Yoshihito Fujii, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 14/509,983

(22) Filed: Oct. 8, 2014

(65) Prior Publication Data

US 2015/0101861 A1   Apr. 16, 2015

(30) Foreign Application Priority Data

Oct. 11, 2013   (JP) .................................. 2013-213694

(51) Int. Cl.
*H05K 5/00* (2006.01)
*H05K 5/02* (2006.01)

(52) U.S. Cl.
CPC .................................. *H05K 5/0247* (2013.01)

(58) Field of Classification Search
CPC .................................................... H05K 5/0247
USPC .................................................... 174/662, 663
See application file for complete search history.

(56) References Cited

U.S. PATENT DOCUMENTS

| | | | | |
|---|---|---|---|---|
| 2,289,992 A * | 7/1942 | Petersen | ................ | H01B 17/58 174/135 |
| 3,119,978 A * | 1/1964 | Sears | ...................... | G01V 1/16 174/154 |
| 3,492,630 A * | 1/1970 | Gerhard | ................... | H01R 4/20 174/75 R |
| 3,879,571 A * | 4/1975 | Reed | ........................ | H04R 1/06 174/662 |
| 4,385,504 A * | 5/1983 | Perrone | ................. | F25D 23/065 174/663 |
| 4,591,658 A * | 5/1986 | Bauer | .................... | H02G 3/065 174/661 |
| 5,006,960 A * | 4/1991 | Kallin | .................. | H05K 5/0247 174/135 |
| 5,241,136 A * | 8/1993 | Michaelis | ........... | H02G 3/0658 174/135 |

(Continued)

FOREIGN PATENT DOCUMENTS

JP    35-7456 Y    4/1960
JP    61-96585 U   6/1986

(Continued)

OTHER PUBLICATIONS

Korean Notification of Reason for Refusal dated Sep. 7, 2015, for corresponding KR Application No. 10-2014-0097872, 7 pages.

(Continued)

*Primary Examiner* — Hung V Ngo
(74) *Attorney, Agent, or Firm* — Seed Intellectual Property Law Group LLP

(57) ABSTRACT

A cable is drawn through a first opening of a cable holder from a rear side to a front side, and drawn back through a second opening to the rear side, and drawn again through a third opening to the front side. The cable holder on which the cable is wound is contained in a chamber of a load cell. Central lines of the cable are soldered to a circuit board in the load cell. A male thread of a nut is screwed into a female thread of the chamber, so that the cable holder is pressed against a front side of the chamber via a rubber sleeve.

12 Claims, 11 Drawing Sheets

(56) References Cited

U.S. PATENT DOCUMENTS

| | | | | |
|---|---|---|---|---|
| 6,133,527 | A * | 10/2000 | Park | H02G 3/18 174/135 |
| 6,365,831 | B1 * | 4/2002 | Rupp | H02G 3/083 174/50 |
| 6,889,574 | B2 * | 5/2005 | Meyer | F16C 1/105 74/502.4 |
| 7,568,943 | B2 | 8/2009 | Harrison et al. | |
| 7,641,503 | B1 | 1/2010 | van der Horn et al. | |
| 7,727,003 | B2 * | 6/2010 | Ceroll | B25F 5/00 439/447 |
| 7,943,866 | B2 * | 5/2011 | Oya | H02G 11/00 174/135 |
| 8,878,069 | B2 * | 11/2014 | Kim | B60R 16/0215 174/135 |
| 2011/0119660 | A1 | 5/2011 | Tanaka | |
| 2013/0020448 | A1 * | 1/2013 | Takishita | H01M 2/206 248/74.1 |
| 2015/0138785 | A1 * | 5/2015 | Oksengendler | F21V 15/012 362/374 |
| 2015/0287497 | A1 * | 10/2015 | Shiga | B60R 16/0215 174/84 R |
| 2017/0006720 | A1 * | 1/2017 | Palmer | H05K 5/0247 |

FOREIGN PATENT DOCUMENTS

| | | |
|---|---|---|
| JP | 62-135488 U | 8/1987 |
| JP | 2000-039536 A | 2/2000 |
| JP | 2002-165758 A | 6/2002 |
| JP | 2010-039536 A | 2/2010 |
| JP | 2012-512524 A | 5/2012 |
| JP | 4982491 B2 | 7/2012 |

OTHER PUBLICATIONS

Korean Office Action, Dated Sep. 19, 2016, for Korean Application No. 20-2016-0003440, 7 pages (with English Translation).

Japan Patent Office, Office Action for JP Application No. 2013-213694, dated Apr. 26, 2017, 11 pages (with English-language translation).

* cited by examiner

CABLE FIXING DEVICE

CROSS-REFERENCE TO RELATED APPLICATIONS

The present application claims priority under 35 U.S.C §119 to Japanese Patent Application No. 2013-213694 filed on Oct. 11, 2013. The above application is hereby expressly incorporated by reference, in its entirety, into the present application.

BACKGROUND OF THE INVENTION

1. Field of the Invention

The present invention relates to a cable fixing device used for fixing a cable on electronic equipment.

2. Description Related to the Prior Art

Electronic equipment uses a cable to transmit various types of electric signals to peripheral equipment. Taking a measuring instrument as an example, the measuring instrument is connected to a control instrument through a cable in order to establish communication of a measurement command signal, a measurement signal, and the like between the measuring instrument and the control instrument.

The cable is composed of a plurality of central lines and a resin sheath (jacket) for protecting the central lines. Each central line is connected to a circuit board provided in the electronic equipment. This connection is often established by soldering. If the cable is pulled or twisted during the use of the electronic equipment, the tension or torsion is transmitted to the cable in the electronic equipment. Repetition of transmission of the tension or torsion causes fatigue of a solder joint of each central line, and brings about a break.

For the purpose of preventing the transmission of the tension or torsion of the cable to the inside of the electronic equipment, a cable fixing device is used to fix the cable on the electronic equipment. Japanese Utility Model Laid-Open Publication No. 62-135488 describes a cord fixing device in which a plurality of engaging plates is formed in parallel integrally on a cord, though it is not a cable, with a gap left between each two of the engaging plates. Each of the gaps and the engaging plates differs in size. Depending on the size of a slit formed in a frame of electric equipment (corresponding to the electronic equipment), an appropriate gap is chosen out of the plurality of gaps, and the chosen gap is engaged into the slit. Two of the parallel engaging plates are disposed in front of and behind the frame, to regulate back-and-forth movement of the cord. Thus, even if the cord is pulled or twisted, this movement is prevented from being transmitted to the cord in the electronic equipment. Note that the Japanese Utility Model Laid-Open Publication No. 62-135488 describes that a fixing board formed with a plurality of openings is used and the cord is drawn through each opening. This fixing board does not aim to eliminate the tension or torsion, but aims to straighten the cords for the purpose of preventing entwinement of the cords in the electronic equipment.

As an example of the electronic equipment, a load cell is known. The load cell measures a load of an object suspended thereon by converting the amount of strain into an electric signal. An obtained load signal is sent to a control instrument through a cable. The load cells use several types of cable fixing devices in order to protect a connection portion of the cable.

According to one type of the cable fixing devices, the cable is secured by a rubber sleeve formed with a flange at its distal end. The load cell is formed with a cable chamber in its cell body. This chamber is in the shape of a round tube and conical at its front end. The rubber sleeve is fitted onto the cable and then inserted into the chamber. Screwing a nut, which is fitted onto the rubber sleeve, into the chamber presses the flange against the conical portion. The pressed flange catches and secures the cable.

In addition to the use of the rubber sleeve, it is also known that a stopper is formed with an adhesive or a wire in the cell body for reinforcement. A partition that is formed with a small opening for drawing the cable therethrough is present between the cell body and the chamber. Focusing attention on this partition, the cable present inside of the partition is wound with the wire or secured to the partition with the adhesive, as the stopper.

Another type of the cable fixing devices is a pair of half clamps of an approximately half ring shape that catches the circumference of the cable to secure the cable. The pair of half clamps is inserted into the chamber in a state of being disposed onto the circumference of the cable. Then, a nut that is fitted onto the cable is screwed into the chamber. Since this nut presses the half clamps, the half clamps get near each other along the conical portion, and hence catch the circumference of the cable and secure the cable.

The cord fixing device according to the Japanese Utility Model Laid-Open Publication No. 62-135488 is available to a cable, but is not available to a general-purpose cable because the plurality of engaging plates is formed integrally with the cable. Also, since a pair of engaging plates is fitted into the slit of the plate-shaped frame, this cord fixing device cannot be used in electronic equipment that does not have a plate-shaped secure portion, and has limited applications.

The sheath of the cable is made of fluororesin inmost cases. The fluororesin are smooth and have a low coefficient of friction against rubber. Thus, the cable fixing device that secures the cable by using the rubber sleeve cannot securely fix the cable, and strongly pulling or twisting the cable moves the cable in the rubber sleeve. Furthermore, the enforcement with the wire or the adhesive is inferior in durability, because the adhesive deteriorates with use. There are also problems that the wire is vulnerable to torsion and needs time and effort at mounting.

According to the cable fixing device that secures the cable by the pair of half clamps, the half clamps dig into the cable. Thus, the cable is susceptible to damage and the central lines possibly break. Also, repetition of application of the tension or torsion to the cable chips or deforms the sheath. Since the half clamps are made of metal, not rubber, the fixation of the cable is loosened.

SUMMARY OF THE INVENTION

An object of the present invention is to provide a cable fixing device that is available to a general-purpose cable and able to securely fix the cable with easy operation.

To achieve the above and other objects, a cable fixing device according to the present invention includes a cable holder formed with a cable insertion portion, a chamber, and a holding mechanism. A cable is drawn through the cable insertion portion from a rear side to a front side, and back to the rear side, and again to the front side, so that friction prevents the cable from being pulled out. The chamber contains the cable holder. The holding mechanism holds the cable holder in the chamber.

The chamber is preferably in the shape of a cylinder whose rear side is open. The holding mechanism preferably has a female thread formed in the chamber and a nut for pressing the cable holder against a front side of the chamber by being screwed into the female thread.

Furthermore, the holding mechanism preferably has a rubber cylinder formed with a flange at a distal end thereof. It is preferable that the flange press the cable holder against the front side of the chamber by means of containing the rubber cylinder in a state of being fitted on the cable in the chamber and pressing the rubber cylinder with the nut.

Also, the cable insertion portion preferably includes at least three openings or cutouts, or an opening or a cutout of such a size as to be able to draw the cable once therethrough and another opening or another cutout of such a size as to be able to draw the cable at least twice therethrough.

Furthermore, the cable holder is preferably made of a plate.

Also, the chamber is preferably provided in electronic equipment, and the cable is preferably pulled out of the chamber into the electronic equipment.

Moreover, the cable fixing device preferably includes a tubular cable gland to be secured to the electronic equipment. The chamber is preferably formed in the cable gland, and the cable is preferably pulled into the electronic equipment through the cable gland.

According to the present invention, the cable holder is formed with the cable insertion portion. The cable is drawn through the cable holder from the rear side to the front side, and back to the rear side, and again to the front side. Then, the cable holder is held in the chamber. Thus, if the cable is pulled or twisted, the friction between the cable and the cable insertion portion prevents the tension or torsion from being transmitted beyond the cable holder. Therefore, it is possible to securely fix the cable and protect a connection portion of the cable.

Also, since the cable does not need processing, the present invention is applicable to a general-purpose cable. Furthermore, operation is easy, because the cable is drawn through the cable holder and then this cable holder is contained in the chamber.

BRIEF DESCRIPTION OF DRAWINGS

For a more complete understanding of the present invention, and the advantages thereof, reference is now made to the subsequent description taken in conjunction with the accompanying drawings, in which.

DESCRIPTION OF THE PREFERRED EMBODIMENTS

Figure 1:
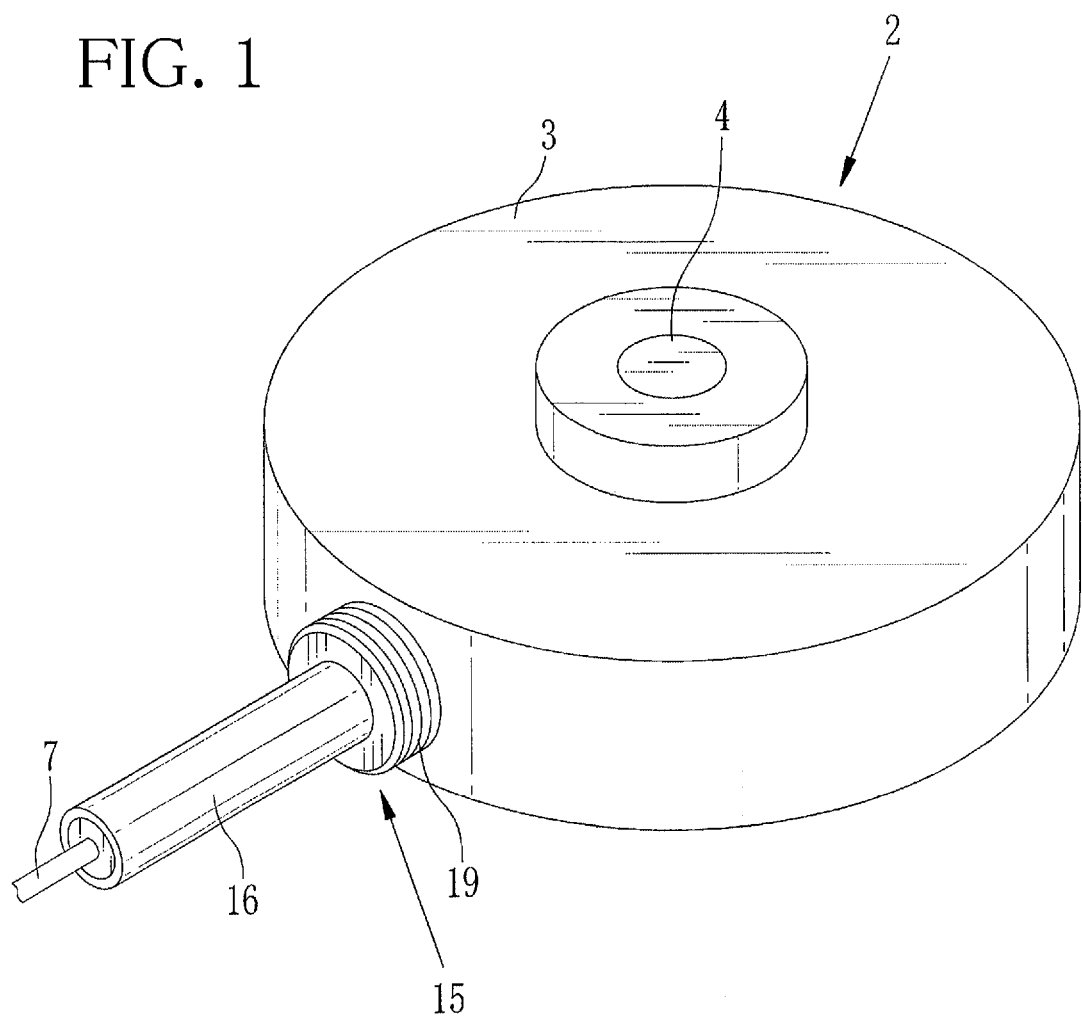
FIG. 1 is a perspective view of a load cell using a cable fixing device according to the present invention.
Figure 2:
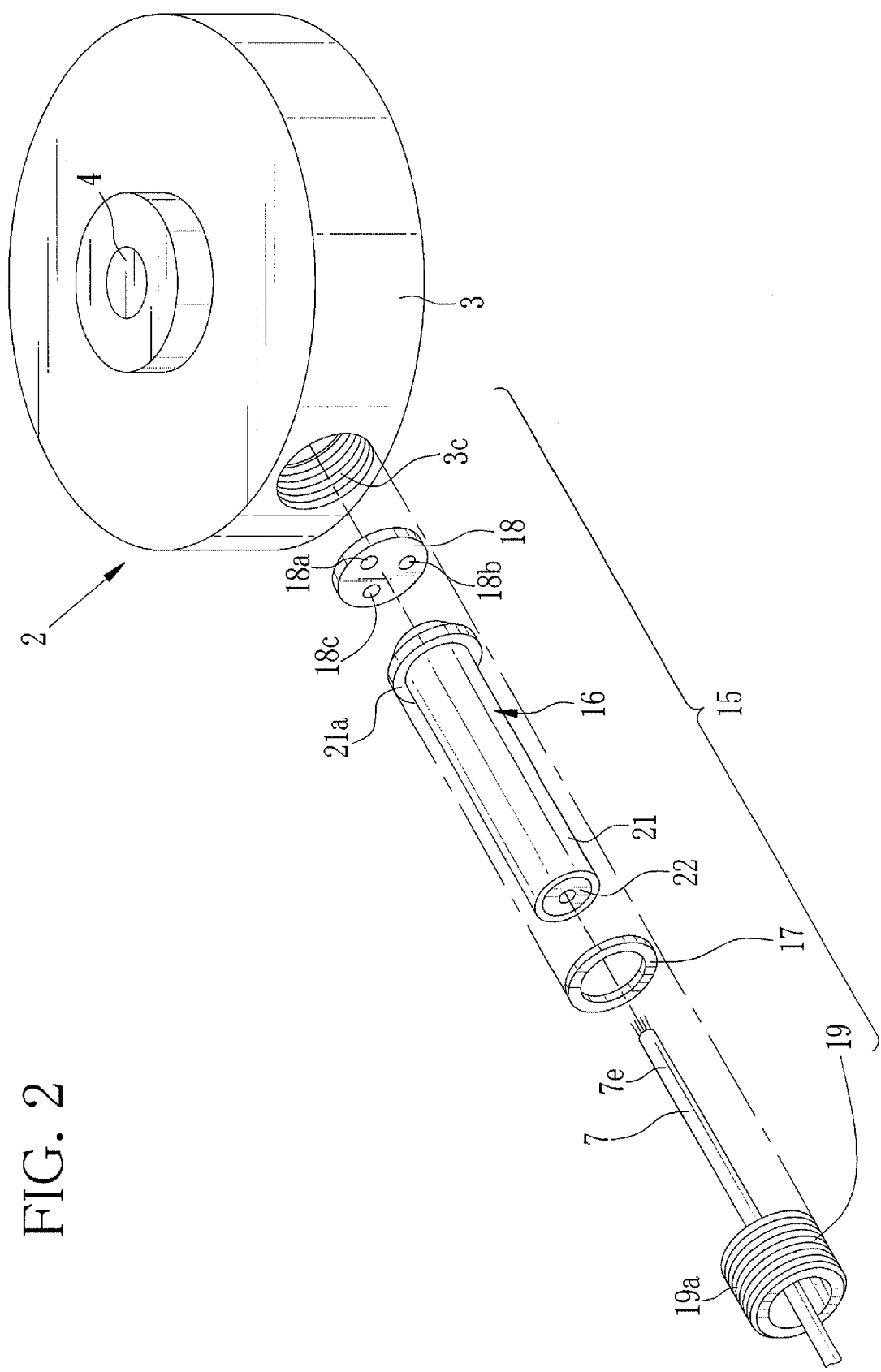
FIG. 2 is an exploded perspective view of the cable fixing device that shows a state of being attached to the load cell.
Figure 3:
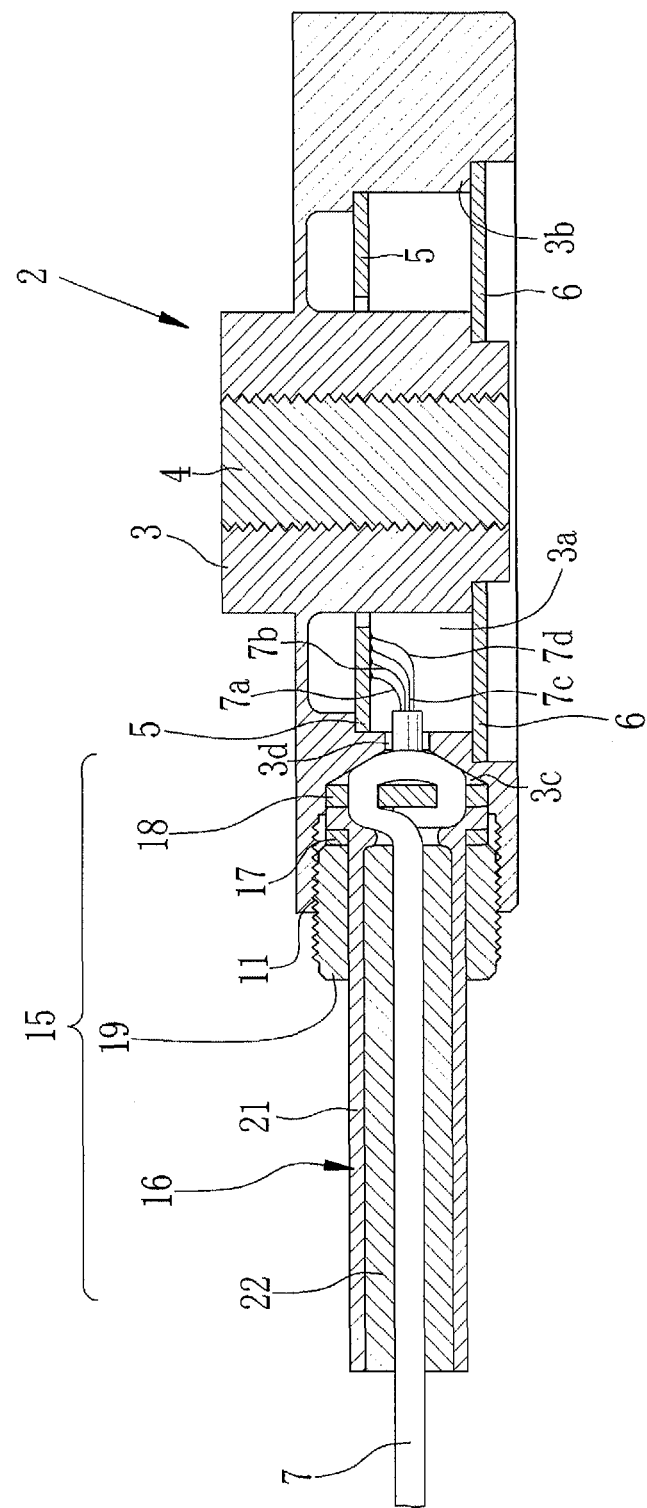
FIG. 3 is a cross sectional view of the load cell to which a cable is connected.

As shown in FIGS. 1 to 3, a load cell (electronic equipment) 2 is constituted of a cell body 3, an axis 4 attached to the center of the cell body 3, a ring-shaped circuit board 5, and a lid 6. The load cell 2 measures a load applied to the axis 4. Note that, the structure of a measuring section is omitted because of no relation to the present invention. The cell body 3 is formed with a hollow 3a into which the circuit board 5 is disposed, a shoulder 3b for receiving the lid 6, and a chamber 3c for fixing a cable 7 connected to the circuit board 5. The load cell 2 is used for measuring a load or the like, for example.

The chamber 3c takes the shape of a round tube, and is formed with a female thread 11 in its interior wall. A front side of the chamber 3c is in a conical shape, and formed with a through hole 3d for coupling the hollow 3a to the chamber 3c.

A cable 7 is constituted of a plurality of central lines 7a to 7d and a sheath (jacket) 7e made of soft resin (fluororesin or the like) for protecting the central lines 7a to 7d. This cable 7 is attached to the cell body 3 via a cable fixing device 15 so that the action of tension or torsion is shut off inside the chamber 3c.

In this embodiment, the cable fixing device 15 has the chamber 3c, a disc-shaped cable holder 18 on which the cable 7 is wound for friction coupling, and a nut 19. A male thread 19a formed on the outer periphery of the nut 19 is screwed into the female thread 11 of the chamber 3c so as to hold the cable holder 18 inside the chamber 3c. This nut 19 and the female thread 11 are used as an example of a holding mechanism.

Furthermore, a rubber sleeve 16 and washer 17 are used in the cable fixing device 15. The rubber sleeve 16 protects the cable 7, and also helps press the cable holder 18 against the front side of the chamber 3c, even if the nut 19 gets loosened more or less. The rubber sleeve 16 includes a rubber external cylinder 21 and a soft resin internal cylinder 22 fitted in the external cylinder 21. The external cylinder 21 is formed with a flange 21a at its distal end. A front surface of the flange 21a is formed into a tapered surface 21b (see FIG. 6). By pressing the nut 19 against the flange 21a, the tapered surface 21b is pressed against the cable holder 18 and deformed, so that the rubber sleeve 16 secures the cable holder 18.

Figure 6:
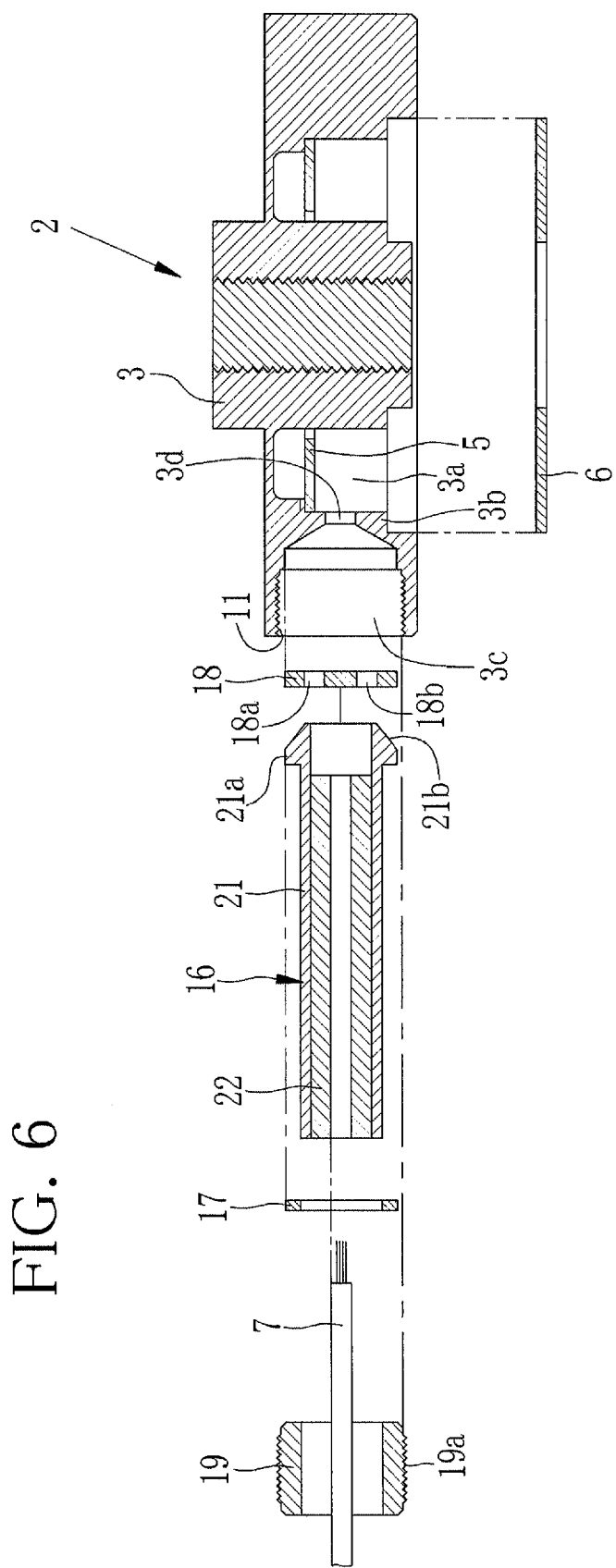
FIG. 6 is an exploded cross sectional view in a state before winding the cable on the cable holder.

In order to ease the deformation of the flange 21a, the internal cylinder 22 is shorter than the external cylinder 21 so that the internal cylinder 22 is not present inside the flange 21a (see FIG. 6). The washer 17 made of metal, for example, is fitted onto the rubber sleeve 16. This washer 17 contacts a rear surface of the flange 21a. The washer 17 smoothes a turn of the nut 19 and also protects the flange 21a from damage.

Figure 4:
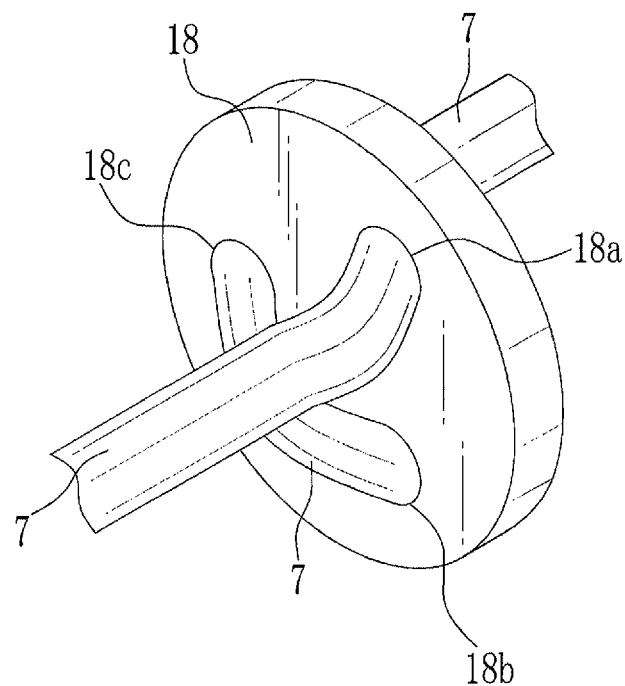
FIG. 4 is a rear perspective view of a cable holder through which the cable is drawn.
Figure 5:
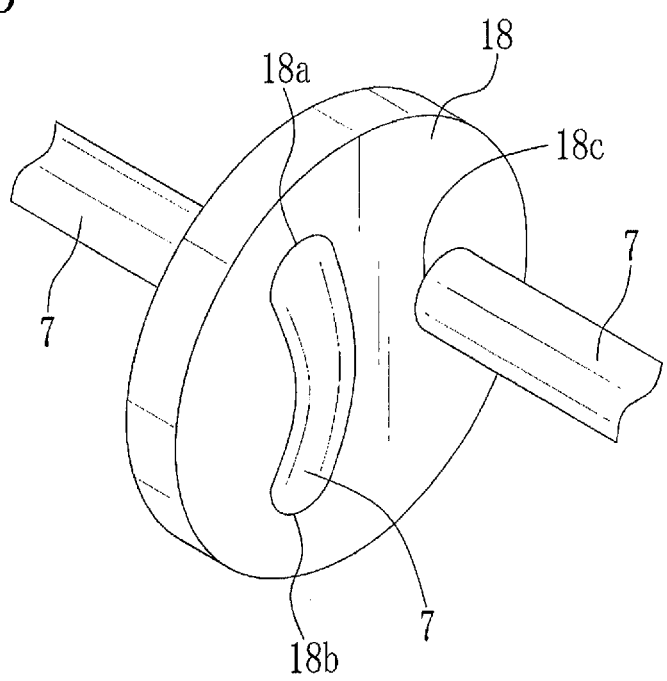
FIG. 5 is a front perspective view of the cable holder through which the cable is drawn.

The cable holder 18 is formed with a first opening 18a, a second opening 18b, and a third opening 18c that have approximately the same diameter as the cable 7 and are formed at equal intervals. As shown in FIGS. 4 and 5, the cable 7, which is inserted into the rubber sleeve 16, is drawn through the first opening 18a from a rear side to a front side.

Then, the cable 7 is drawn back to the rear side through the second opening 18b, and drawn again to the front side through the third opening 18c. Winding the cable 7 on the cable holder 18 through the openings 18a to 18c blocks transmission of tension and torsion of the cable 7 mainly by friction between each of the openings 18a to 18c and the cable 7.

The cable 7 drawn through the third opening 18c is inserted into the chamber 3c, and then inserted into the hollow 3a through the through hole 3d. The four central lines 7a to 7d are soldered to the circuit board 5, for example. In this embodiment, the first to third openings 18a to 18c constitute a cable insertion portion.

Figure 7:
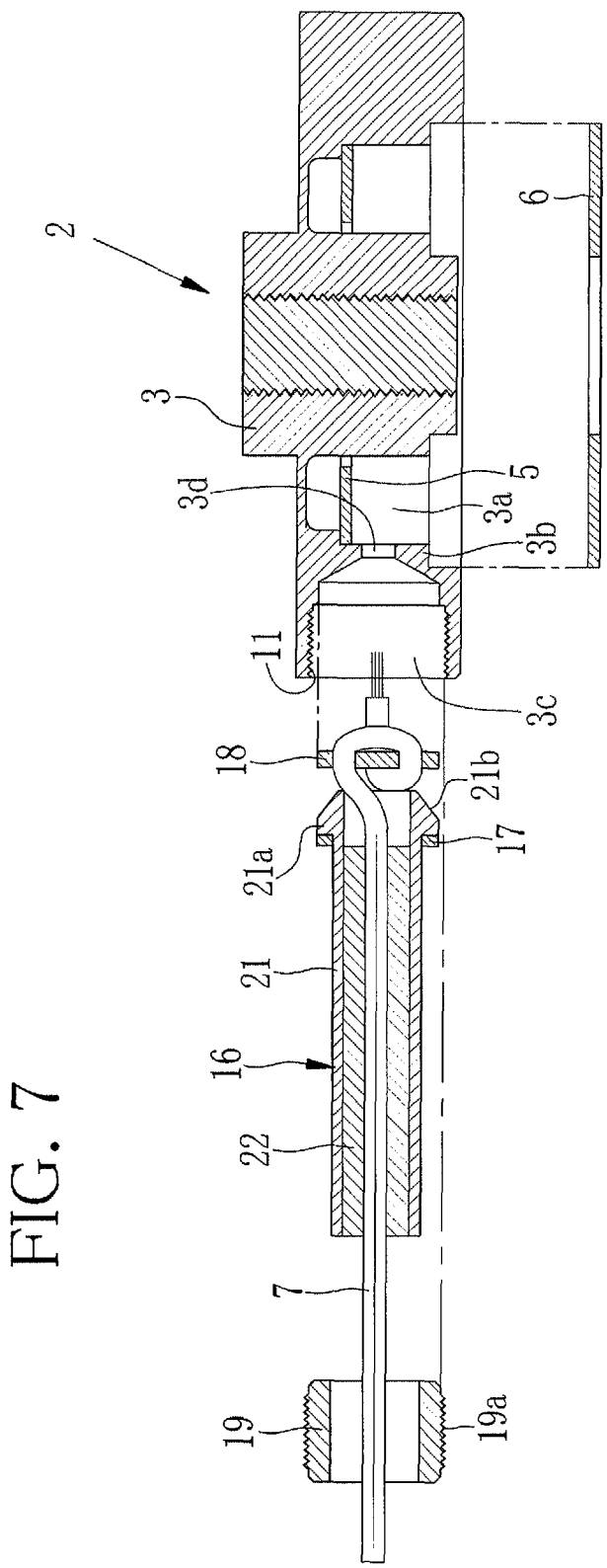
FIG. 7 is an exploded cross sectional view in a state of winding the cable on the cable holder.
Figure 8:
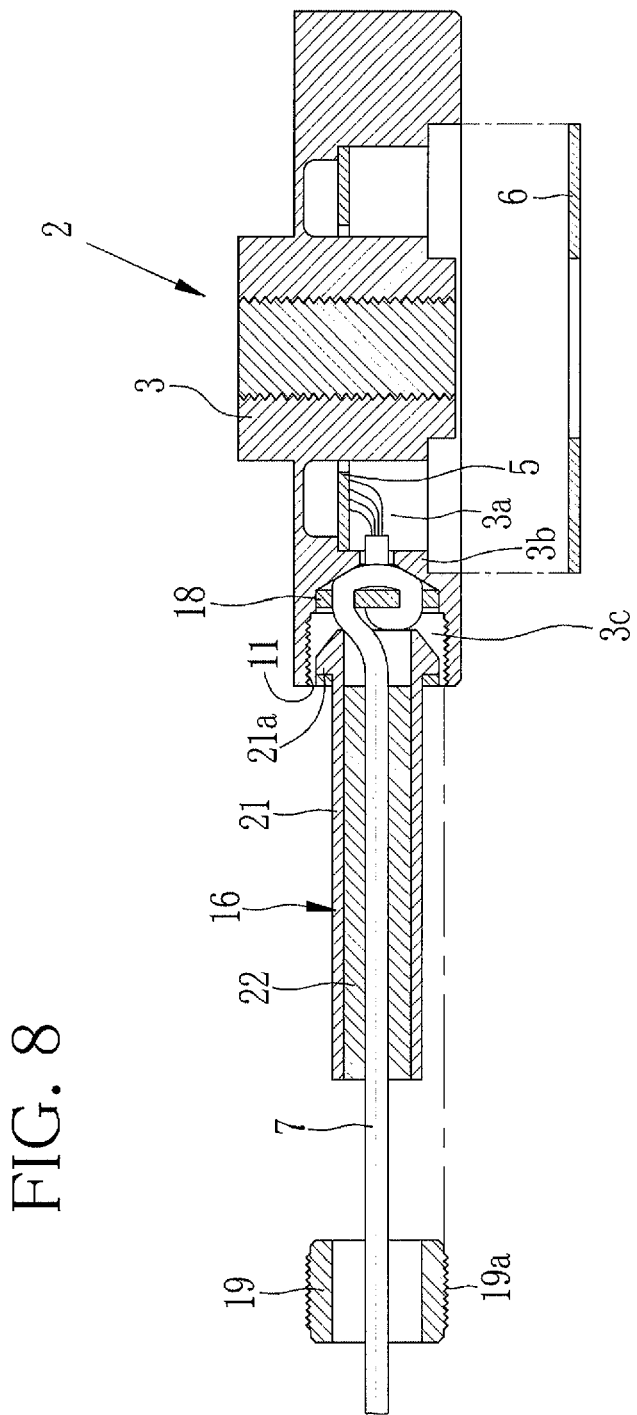
FIG. 8 is a cross sectional view in a state of containing the cable holder in a chamber.

Next, referring to FIGS. 6 to 8, attachment of the cable 7 to the load cell 2 will be described. First, from a state shown in FIG. 6, the cable 7 is inserted into the rubber sleeve 16. Then, as shown in FIGS. 4 and 5, a distal end of the cable 7 is drawn through the first opening 18a of the cable holder 18 from the rear side to the front side, and drawn back to the rear side through the second opening 18b, and drawn again to the front side through the third opening 18c. Then, as shown in FIGS. 7 and 8, the cable holder 18 through which the cable 7 is drawn is contained in the chamber 3c, and the cable 7 is inserted into the hollow 3a through the through hole 3d. The central lines 7a to 7d drawn out of the cable 7 are soldered to the circuit board 5 that is secured inside the hollow 3a of the cell body 3.

The cable 7 is threaded through the washer 17 and the nut 19, and the male thread 19a of the nut 19 is screwed into the female thread 11 of the chamber 3c. The nut 19 moves forward with pushing the washer 17, and, as shown in FIG. 3, presses the flange 21a of the rubber sleeve 16 via the washer 17. The flange 21a is deformed so as to get into space on the front side of the internal cylinder 22. This deformed portion presses the cable holder 18 against the front side of the chamber 3c. Thus, the cable holder 18 is secured inside the chamber 3c. In this state, the lid 6 is disposed on the shoulder 3b of the cell body 3, and secured with an adhesive. Note that the lid 6 may be secured at the time of soldering the central lines 7a to 7d pulled out of the cable 7 to the circuit board 5 secured inside the hollow 3a of the cell body 3.

Attaching to a tip end of the load cell 2 a measurement object whose load is to be measured applies the weight of the object to the load cell 2. A measurement voltage occurs in the load cell 2 in accordance with the load applied thereto. The measurement voltage is amplified by an amplifier and converted into a digital signal by an A/D converter, and then sent to a control instrument (none of them is shown), for example.

During using the load cell 2 or connecting the load cell 2 to the control instrument, the cable 7 is possibly pulled or twisted. Since the cable 7 is drawn through the first to third openings 18a to 18c of the cable holder 18 so as to be wound thereon, the cable 7 cannot move from the cable holder 18 even if the cable 7 is pulled strongly, and the torsion cannot be transmitted beyond the cable holder 18 even if the cable 7 is twisted. This prevents solder joints between each of the central lines 7a to 7d and the circuit board 5 from coming off.

Figure 9:
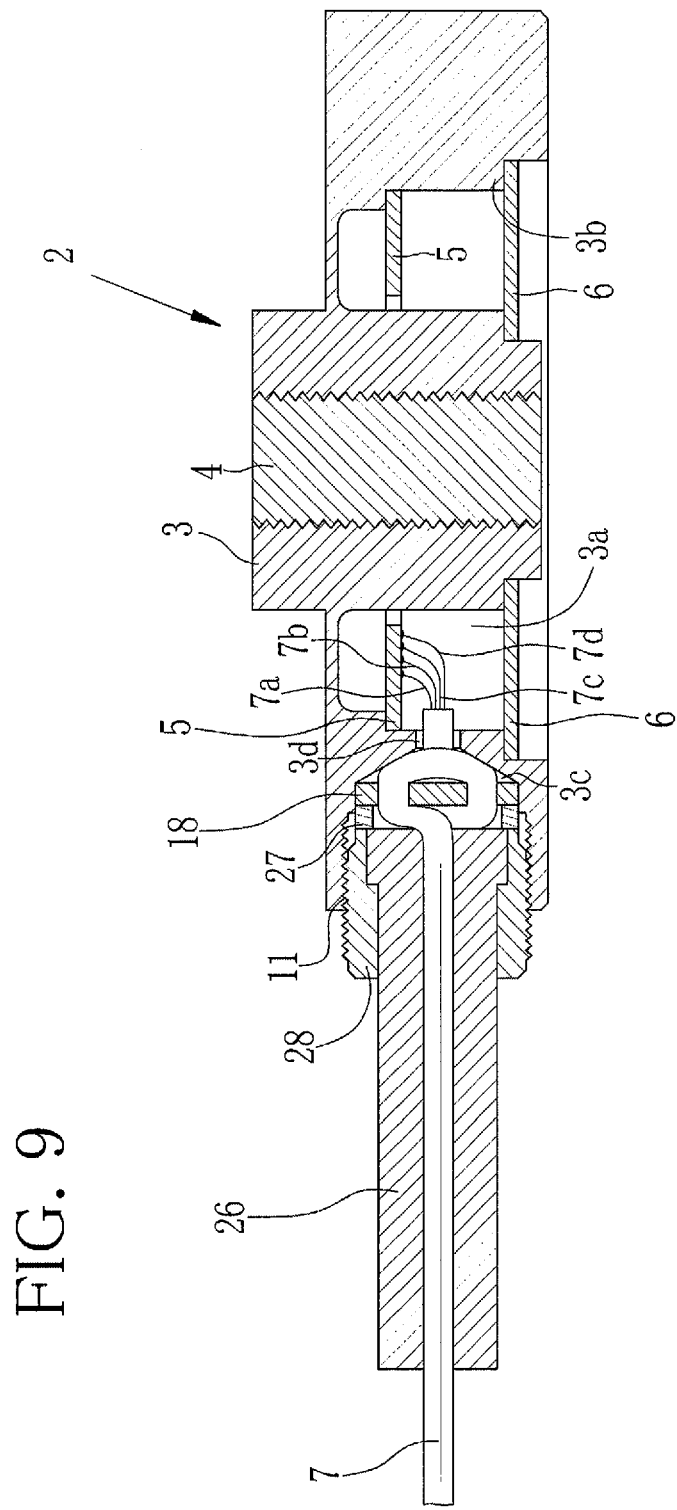
FIG. 9 is a cross sectional view of an embodiment in which a rubber sleeve is formed into one unit.

FIG. 9 shows an embodiment of using a rubber sleeve 26 in which the external cylinder and the internal cylinder of the above embodiment are formed integrally into one piece. A washer 27 is disposed between the rubber sleeve 26 and the cable holder 18. A front surface of the rubber sleeve 26 and a front surface of a nut 28 contact a rear surface of the washer 27. The nut 28 presses the cable holder 18 against the front side of the chamber 3c via the washer 27. The nut 28 also presses the rubber sleeve 26 against the washer 27. Since an opening of the rubber sleeve 26 is displaced from the first opening 18a through which the cable 7 is first drawn in a radial direction of the cable holder 18, the rubber sleeve 26 contacts the cable 7 in such a state that the front surface of the rubber sleeve 26 is slightly deformed. Accordingly, stress that is applied to the cable 7 by a pull is dispersed between a contact point with a deformed portion of the rubber sleeve 26 and a contact point with the first opening 18a of the cable holder 18, so the cable 7 is not torn even if being pulled strongly. Also, this embodiment can reduce the number of parts.

Figure 10:
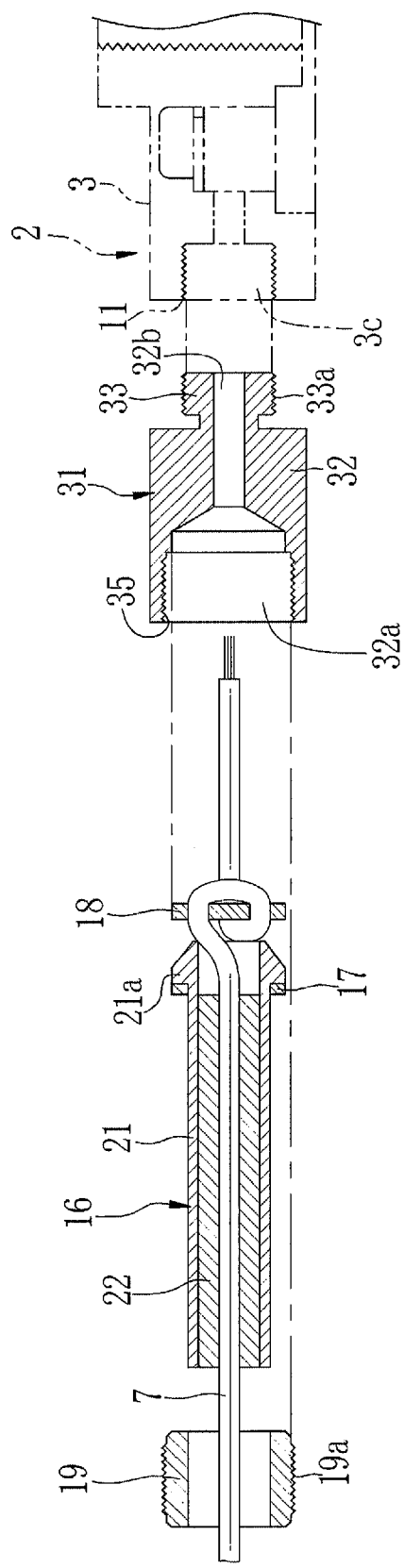
FIG. 10 is an exploded cross sectional view of an embodiment of using a cable gland.
Figure 11:
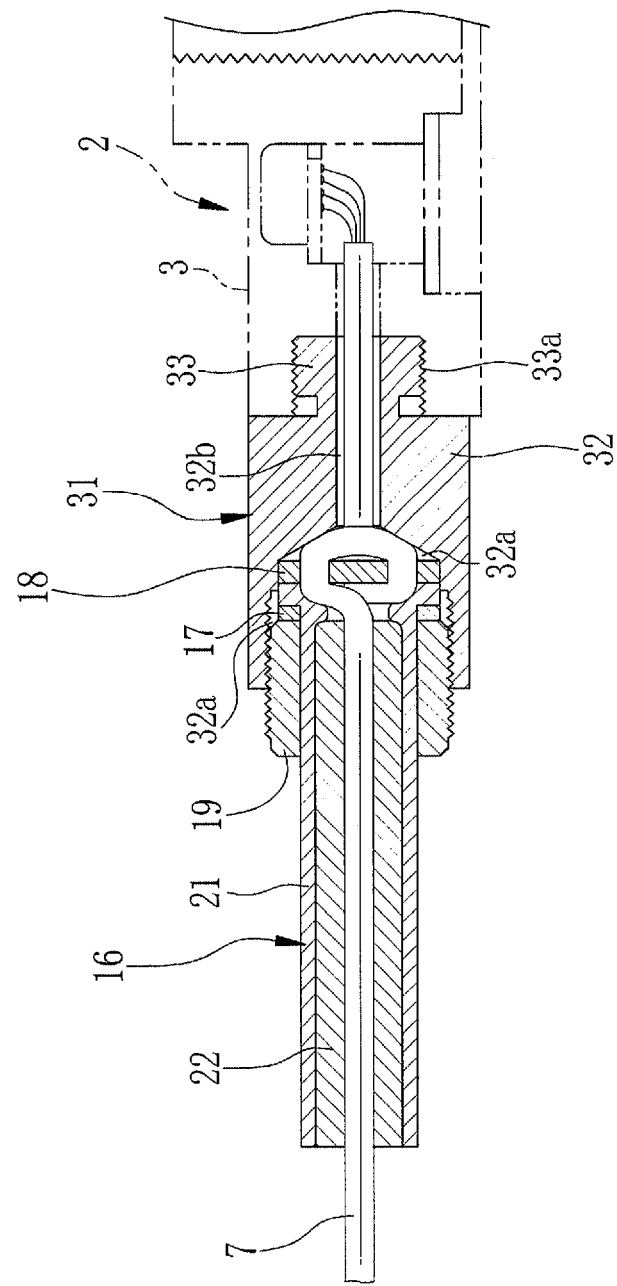
FIG. 11 is a cross sectional view in a state of containing the cable holder in a chamber of the cable gland.

FIGS. 10 and 11 show an embodiment in which the cable 7 is attached to the load cell 2 via a cable gland or cable base 31. Note that the same reference numerals as those of the above embodiments refer to the same components as above, and the detailed description thereof will be omitted.

The cable gland 31 includes a main body 32 and an attachment 33 to be attached to the cell body 3 of the load cell 2. The main body 32 is formed with a chamber 32a for securing the cable 7, and a through hole 32b into which the cable 7 is inserted. This through hole 32b extends to the attachment 33. The chamber 32a is formed in a tapered shape at its front side, and formed with a female thread 35 in its interior wall. A male thread 33a, which is formed in an outer periphery of the attachment 33, is screwed into the female thread 11 of the chamber 3c of the cell body 3, for example.

To attach the cable 7 to the load cell 2, as with the above embodiment, a distal end of the cable 7 is wound on the cable holder 18. Then, the cable holder 18 is contained in the chamber 32a of the cable gland 31. After that, the male thread 19a of the nut 19 is screwed into the female thread 35 of the chamber 32a to secure the cable holder 18 in the chamber 32a. The cable gland 31 attached with the cable 7 is attached to the cell body 3 by screwing the male thread 33a of the attachment 33 into the female thread 11 of the cell body 3. In closing, after the cable 7 is soldered to the circuit board 5, the lid 6 is mounted on the cell body 3.

Figure 12:
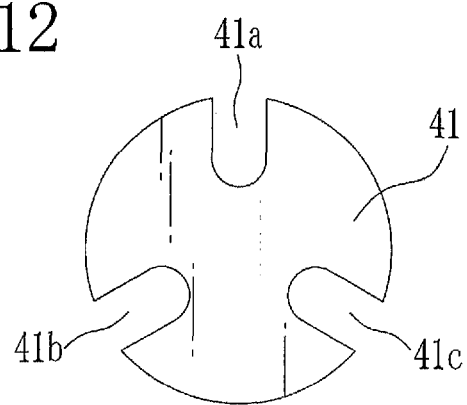
FIG. 12 is a front view of a cable holder formed with first to third cutouts.
Figure 13:
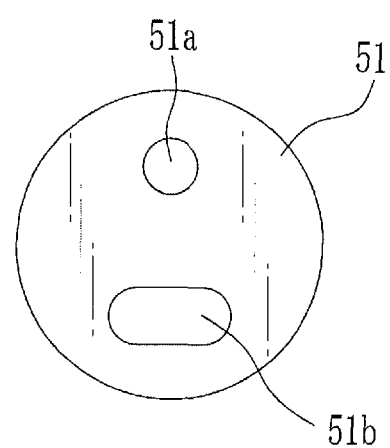
FIG. 13 is a front view of a cable holder formed with first and second openings of different sizes.
Figure 14:
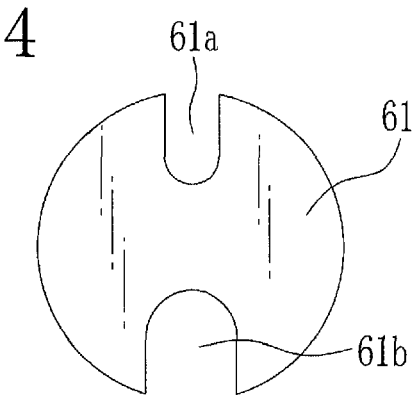
FIG. 14 is a front view of a cable holder formed with first and second cutouts of different sizes.

Also, as shown in FIG. 12, a cable holder 41 formed with first to third cutouts 41a to 41c may be used. Furthermore, as shown in FIG. 13, a cable holder 51 that is formed with a first opening 51a through which the cable 7 can be drawn once and a second opening 51b through which the cable 7 can be drawn twice may be used. Likewise, as shown in FIG. 14, a cable holder 61 formed with a first cutout 61a and a second cutout 61b of different sizes may be used. The cable 7 is drawn through the second cutout 61b twice.

Note that, according to the above embodiments, the cable 7 is wound once on the cable holder 18, but the number of winding is arbitrarily determined in consideration of friction. In the case of winding the cable twice, for example, five openings or cutouts through which the cable is drawn once may be provided. A combination of openings and cutouts may be used. Furthermore, instead of forming the openings and the cutouts, the cable may be wound on a plate-shaped or rod-shaped cable holder.

The load cell is described as electronic equipment, but the present invention is applicable to another type of electronic equipment. Furthermore, connection to the circuit board may be performed by using a connector instead of or in addition to soldering.

Although the present invention has been fully described by way of the preferred embodiment thereof with reference to the accompanying drawings, various changes and modifications will be apparent to those having skill in this field.

Therefore, unless these changes and modifications depart from the scope of the present invention, they should be construed as included therein.

The invention claimed is:

1. A cable fixing device comprising:
a cable holder formed with a cable insertion portion configured to enable a cable to be drawn from a rear side to a front side, drawn back to said rear side, and drawn again to said front side so that friction prevents said cable from being pulled out;
a chamber including a rear side having a shape of a cylinder and being open and a front side having a tapered shape, the chamber being formed to contain said cable holder on which said cable is wound; and
a holding mechanism including a pressing member configured to press said cable holder in said chamber, said holding mechanism holding said cable holder in said chamber with pressing said cable holder to an inner wall formed at the front side having the tapered shape of said chamber by the action of a screw.

2. The cable fixing device according to claim 1, wherein said holding mechanism has a female thread formed in said chamber and a nut, as said pressing member, for pressing said cable holder against the front side of said chamber by being screwed into said female thread.

3. The cable fixing device according to claim 2, wherein said holding mechanism has a rubber cylinder formed with a flange at a distal end; and
said flange presses said cable holder against said front side of said chamber by means of containing said rubber cylinder in a state of being fitted on said cable into said chamber and pressing said rubber cylinder with said nut.

4. The cable fixing device according to claim 1, wherein said cable insertion portion includes at least three openings or cutouts.

5. The cable fixing device according to claim 1, wherein said cable insertion portion includes an opening or a cutout having a size that enables said cable to be drawn once therethrough, and another opening or another cutout having a size that enables said cable to be drawn at least twice therethrough.

6. The cable fixing device according to claim 1, wherein said cable holder is made of a plate.

7. The cable fixing device according to claim 1, further comprising said cable, wherein
said chamber is provided in an electronic equipment; and
said cable at least partially extends out of said chamber into said electronic equipment.

8. The cable fixing device according to claim 1, further comprising:
said cable; and
a tubular cable gland configured to be secured to an electronic equipment, wherein
said chamber is formed in said cable gland; and
said cable at least partially extends into said electronic equipment through said cable gland.

9. A cable fixing device comprising:
a cable holder formed with a cable insertion portion configured to enable a cable to be drawn from a rear side to a front side and back to said rear side and again to said front side so that friction prevents said cable from being pulled out of said cable holder;
a chamber configured to contain said cable holder, wherein at least one first thread is formed in said chamber; and
a holding mechanism configured to hold said cable holder in said chamber, wherein said holding mechanism includes a nut with at least one second thread formed thereon, said at least one second thread configured to engage said at least one first thread.

10. The cable fixing device according to claim 9, wherein
said chamber is in the shape of a cylinder having a rear side that is open;
said at least one first thread includes at least one female thread;
said at least one second thread includes at least one male thread; and
said nut presses said cable holder against a front side of said chamber when said at least one male thread is screwed into said at least one female thread.

11. A cable fixing device comprising:
a cable holder formed with a cable insertion portion configured to enable a cable to be drawn from a rear side to a front side, drawn back to said rear side, and drawn again to said front side so that friction prevents said cable from being pulled out;
a chamber having a shape of a cylinder whose rear side is open and being formed to contain said cable holder on which said cable is wound; and
a holding mechanism including a pressing member configured to press said cable holder in said chamber, said holding mechanism holding said cable holder in said chamber with pressing said cable holder to an inner wall of said chamber by the action of a screw,
wherein said holding mechanism has a female thread formed in said chamber and a nut, as said pressing member, for pressing said cable holder against a front side of said chamber by being screwed into said female thread.

12. The cable fixing device according to claim 11, wherein said holding mechanism has a rubber cylinder formed with a flange at a distal end; and
said flange presses said cable holder against said front side of said chamber by means of containing said rubber cylinder in a state of being fitted on said cable into said chamber and pressing said rubber cylinder with said nut.

* * * * *